US 6,532,584 B1

(12) United States Patent
Nishida et al.

(10) Patent No.: US 6,532,584 B1
(45) Date of Patent: Mar. 11, 2003

(54) CIRCUIT SYNTHESIS METHOD

(75) Inventors: Koichi Nishida, Tenri (JP); Kazuhisa Okada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 190 days.

(21) Appl. No.: 09/709,294

(22) Filed: Nov. 13, 2000

(30) Foreign Application Priority Data

Jan. 28, 2000 (JP) ........................................ 2000-020973

(51) Int. Cl.⁷ .............................................. G06F 17/50
(52) U.S. Cl. ............................................ 716/18; 716/3
(58) Field of Search ........................................ 716/1–21

(56) References Cited

U.S. PATENT DOCUMENTS

| | | | | |
|---|---|---|---|---|
| 5,513,118 A | | 4/1996 | Dey | 364/490 |
| 5,764,951 A | * | 6/1998 | Ly et al. | 395/500 |
| 5,831,864 A | * | 11/1998 | Raghunathan et al. | 364/488 |
| 6,195,786 B1 | * | 2/2001 | Raghunathan et al. | 716/2 |
| 6,275,969 B1 | * | 8/2001 | Lakshmisnaryana et al. | 716/2 |
| 6,308,313 B1 | * | 10/2001 | Lakshmisnaryana et al. | 716/18 |

FOREIGN PATENT DOCUMENTS

JP    05-101141    4/1993

OTHER PUBLICATIONS

Reinaldo A. Bergamaschi, "Behavioral Network Graph Unifying the Domeain of High–Level and Logic Synthesis," IEEE, Jun. 1999, pp. 213–218.*

Potkonjak et al, "Behavioral Optimization Using the Manipulation of Timing Constraints," IEEE, Oct. 1998, pp. 936–947.*

Lakshminarayana et al, "Wavesched: A N Ovel Scheduling Technique for Control–Flow Intensive Behavioral Descriptions," IEEE, 1997, pp. 244–250.*

Chen et al, "Multipar: Behavioral Partition for Synthesizing Multiprocessor Architectures," IEEE, Mar. 1994, pp. 21–32.*

"False Loops Through Resource Sharing", Stok, L., Computer–Aided Design, 1992. ICCAD–92. Digest of Technical Papers, 1992 IEEEE/ACM, International Conf 1992 pp. 345–348.

* cited by examiner

Primary Examiner—Vuthe Siek
(74) Attorney, Agent, or Firm—Birch, Stewart, Kolasch & Birch, LLP

(57) ABSTRACT

A circuit synthesis method includes the steps of converting a behavioral description describing a behavior of calculation processing into a control data flowgraph; assigning a plurality of calculations, at least one input and at least one output in the control data flowgraph into a plurality of prescribed time slots; assigning the plurality of calculations, a plurality of data dependency edges, the at least one input and the at least one output respectively to a plurality of calculation devices, at least one register, at least one input pin and at least one output pin; generating a plurality of paths corresponding to the plurality of data dependency edges; detecting a feedback loop formed of at least two of the plurality of paths and at least one of the plurality of calculation devices; and re-assigning one calculation, which has been assigned to a first calculation device included in the feedback loop, to a second calculation device among the plurality of calculation devices, so as to delete the feedback loop.

6 Claims, 17 Drawing Sheets

Scheduling step

Scheduling step

Scheduling step

CIRCUIT SYNTHESIS METHOD

BACKGROUND OF THE INVENTION

1. Field of the Invention

The present invention relates to a circuit synthesis method for an LSI for automatically generating a logic circuit of a register transfer level (RTL) from a behavioral description, and specifically to a high level synthesis method which is especially effective for designing devices which need to be designed within a short period of time such as, for example, ASICs (Application Specific Integrated Circuits).

2. Description of the Related Art

High level synthesis is a technology for automatically generating an RTL logic circuit from a behavioral description which describes only a behavior of calculation processing and does not include information on a hardware structure. High level synthesis is described in detail in Daniel Gajski, Allen Wu, Nikil Dutt and Steve Lin, "High-Level Synthesis" published by Kluwer Academic Publishers, 1992. High level synthesis is also disclosed in Japanese Laid-Open Publication No. 5-101141. High level synthesis will be described briefly below. <Conversion of behavioral description into CDFG>

In high level synthesis, a behavioral description describing only a behavior of calculation processing is analyzed, and then the behavioral description is converted into a model referred to as a control data flowgraph (CDFG) representing the dependency among the calculations, i.e., the execution order of the calculations.

For example, a behavioral description of expression (1) is converted into a CDFG in the following manner.

$$f=\{(a*b)+c(b+d))\}*e \quad (1)$$

A CDFG is a graph in which calculations, inputs and outputs are represented by nodes, and data dependency (i.e., execution order of calculations, inputs and outputs) is represented by directional edges (data dependency edges; e.g., arrows). For example, in FIG. 1, which illustrates a CDFG 100 corresponding to the behavioral description of expression (1), a data dependency edge 14 indicates that an addition 5 is performed after a first multiplication 4 is performed. In the CDFG 100, inputs "a", "b", "c", "d" and "e" are respectively represented by reference numerals 28 through 32, and an output "f" is represented by reference numeral 33. As mentioned above, the first multiplication ("*") is represented by reference numeral 4, and first, second and third additions ("+") are respectively represented by reference numerals 5, 6 and 7. A second multiplication ("*") is represented by reference numeral 8. In this specification, symbol "*" indicates multiplication.

A data dependency edge from the input "a" 28 to the first multiplication 4 is represented by reference numeral 11. A data dependency edge from the input "b" 29 to the first multiplication 4 is represented by reference numeral 12. A data dependency edge from the input "b" 29 to the second addition 6 is represented by reference numeral 13. A data dependency edge from the first multiplication 4 to the first addition 5 is represented by reference numeral 14. A data dependency edge from the input "c" 30 to the first addition 5 is represented by reference numeral 15. A data dependency edge from the input "d" 31 to the second addition 6 is represented by reference numeral 16. A data dependency edge from the first addition 5 to the third addition 7 is represented by reference numeral 17. A data dependency edge from the second addition 6 to the third addition 7 is represented by reference numeral 18. A data dependency edge from the third addition 7 to the second multiplication 8 is represented by reference numeral 19. A data dependency edge from the input "e" 32 to the second multiplication 8 is represented by reference numeral 20. A data dependency edge from the second multiplication 8 to the output "f" 33 is represented by reference numeral 21.

<Scheduling>

After the behavioral description of expression (1) is converted into the CDFG 100 (FIG. 1), scheduling is performed. Scheduling is processing for assigning the calculations, inputs and the outputs to time slots. (The CDFG 100 (FIG. 1) includes only one output.) Each time slot corresponds to a state of a finite state machine and is referred to as a scheduling step.

FIG. 2 shows a scheduling result 110 obtained as a result of scheduling the CDFG 100 (FIG. 1). In FIG. 2, the input "a" 28 and the input "b" 29 are scheduled in scheduling step 0. The first multiplication 4, the input "c" 30, the input "d" 31, the first addition 5 and the second addition 6 are scheduled in scheduling step 1. The third addition 7, the input "e" 32 and the second multiplication 8 are scheduled in scheduling step 2. Only the output "f" 33 is scheduled in scheduling step 3.

The same type of calculations scheduled in different scheduling steps can share one calculation device. In FIG. 2, the first addition 5 and the third addition 7 are respectively scheduled in scheduling steps 1 and 2, and therefore can share one calculation device. The second addition 6 and the third addition 7 are also respectively scheduled in scheduling steps 1 and 2, and therefore can share one calculation device. The first multiplication 4 and the second multiplication 8 are respectively scheduled in scheduling steps 1 and 2, and therefore can share one calculation device. By scheduling, each of the calculations is assigned to an appropriate scheduling step so as to minimize the cost of the hardware.

In the scheduling result 110 shown in FIG. 2, the data dependency edges 11, 12 and 13 cross the clock boundary between scheduling steps 0 and 1. The data dependency edges 17 and 18 cross the clock boundary between scheduling steps 1 and 2. The data dependency edge 21 crosses the clock boundary between scheduling steps 2 and 3.

<Allocation>

Allocation is processing for allocating calculation devices, registers, and input and output pins required to execute the scheduled CDFG: and assigning the calculations of the CDFG to the calculation devices, assigning the data dependency edges crossing the clock boundaries between two adjacent scheduling steps to the registers, and assigning the inputs and outputs to the input and output pins. (Only one output is necessary for the CDFG 100 in FIG. 1.)

FIGS. 3, 4 and 5 show allocation procedures 120, 121 and 122 performed on the CDFG 100 (FIG. 1) scheduled as shown in FIG. 2. FIG. 3 shows an allocation procedure 120 for the calculation devices; FIG. 4 shows an allocation procedure 121 for the registers; and FIG. 5 shows an allocation procedure 122 for the inputs and the output.

By the allocation procedure 120 for the calculation devices shown in FIG. 3, one multiplier 1 ("mult 1"), and first and second adders 2 and 3 ("adder 1" and "adder 2") are allocated. The first and second multiplications 4 and 8 scheduled in different scheduling steps are assigned to the multiplier 1. The first and third additions 5 and 7 scheduled in different scheduling steps are assigned to the first adder 2. The second adder 6 scheduled in scheduling step 1 is assigned to the second adder 3.

By the allocation procedure 121 for the registers shown in FIG. 4, a first register 41 ("reg 1") and a second register 42 ("reg 2") are allocated. One of the data dependency edges crossing the clock boundary between scheduling steps 0 and 1 (data dependency edge 11) and one of the data dependency edges crossing the clock boundary between scheduling steps 1 and 2 (data dependency edge 17) are assigned to the first register 41. The other data dependency edge crossing the clock boundary between scheduling steps 0 and 1 (data dependency edge 13), the other data dependency edge crossing the clock boundary between scheduling steps 1 and 2 (data dependency edge 18), and the data dependency edge 21 crossing the clock boundary between scheduling steps 2 and 3 are assigned to the second register 42.

By the allocation procedure 122 for the inputs and output shown in FIG. 5, five input pins "a" 22, "b" 23, "c" 24, "d" 25, and "e" 26, and one output pin "f" 27 are allocated. The input "a" 28 is assigned to the input pin "a" 22, the input "b" 29 is assigned to the input pin "b" 23, the input "c" 30 is assigned to the input pin "c" 24, the input "d" 31 is assigned to the input pin "d" 25, and the input "e" 32 is assigned to the input pin "e" 26. The output "f" 33 is assigned to the output pin "f" 27.

<Data path generation>

Data path generation is processing for generating circuit paths corresponding to the data dependency edges in the CDFG. FIG. 6 shows an exemplary data path generation result 130 obtained as a result of the data path generation performed on the CDFG 100 (FIG. 1).

For the calculation devices, registers or the like which are shared, a multiplexer is allocated for selecting data to be input to the calculation devices, registers or the like. In FIG. 6, a first multiplexer 43 ("mux 1") is allocated for the first register 41, and a second multiplexer 44 ("mux 2") is allocated for the second register 42. A third multiplexer 45 ("mux 3")and a fourth multiplexer 46 ("mux 4") are allocated for the multiplier 1. A fifth multiplexer 47 ("mux 5") and a sixth multiplexer 48 ("mux 6") are allocated for the first adder 2.

A data path which corresponds to a path from the input "a" 28 through the data dependency edge 11 to the first multiplication 4 is generated by first generating a path from the input pin "a" 22 through the first multiplexer 43 to the first register 41 and then generating a path from the first register 41 to the multiplier 1. Other data paths are generated in a similar manner.

<Controller generation>

Controller generation is processing for generating a controller for controlling the calculation devices, registers and multiplexers allocated by the allocation and the data path generation.

FIG. 7 shows an exemplary controller generation result 140 obtained as a result of generating a controller 50. The controller 50 controls the first and second multiplexers 43 and 44, the first and second registers 41 and 42, the third and fourth multiplexers 45 and 46, and fifth and sixth multiplexers 47 and 48.

As described above, in high level synthesis, a plurality of calculations connected by data dependency edges can be scheduled in one scheduling step and can share one calculation device. In such high level synthesis, a feedback loop formed of a combination of at least two portions of true paths and at least one calculation device may be generated during the data path generation. The feedback loop is a false path which is not required for operating the circuit. A true path is a data path which becomes entirely active in either one of scheduling steps (i.e., either one of states of the finite state machine); and a false path is a data path which does not become entirely active in either one of scheduling steps.

FIG. 8 shows an exemplary data path generation result 150 obtained for the CDFG 100 (FIG. 1). In the data path generation result 150, a feedback loop 49 from the first multiplier 1—the first adder 2—the third multiplexer 45 to the first multiplier 1 is a false path. The feedback loop 49 is formed by combining a portion of each of the following two true paths. One true path is: the first register 41—the third multiplexer 45—the multiplier 1—the fifth multiplexer 47—the first adder 2—the first multiplexer 43—the first register 41. The other true path is: the first register 41—the fifth multiplexer 47—the first adder 2—the third multiplexer 45—the multiplier 1—the first multiplexer 43—the first register 41. A portion from the first true path: the multiplier 1—the fifth multiplexer 47—the first adder 2 is combined with a portion from the second true path: the first adder 2—the third multiplexer 45—the multiplier 1. Thus, the feedback loop 49 is formed.

A feedback loop is a false path. However, in an actual situation including a path delay, the feedback loop may undesirably become entirely active temporarily before the signal is stabilized. When this occurs, oscillation or the like is caused in the RTL logic circuit and the RTL logic circuit is destabilized.

In addition, when the RTL logic circuit includes a feedback loop, the static timing analysis for the logic synthesis becomes difficult.

SUMMARY OF THE INVENTION

According to one aspect of the invention, a circuit synthesis method includes the steps of converting a behavioral description describing a behavior of calculation processing into a control data flowgraph; assigning a plurality of calculations, at least one input and at least one output in the control data flowgraph into a plurality of prescribed time slots; assigning the plurality of calculations, a plurality of data dependency edges, the at least one input and the at least one output respectively to a plurality of calculation devices, at least one register, at least one input pin and at least one output pin; generating a plurality of paths corresponding to the plurality of data dependency edges; and detecting a feedback loop formed of at least two of the plurality of paths and at least one of the plurality of calculation devices; and re-assigning one calculation, which has been assigned to a first calculation device included in the feedback loop, to a second calculation device among the plurality of calculation devices, so as to delete the feedback loop.

In one embodiment of the invention, the step of re-assigning includes the step of assigning the one calculation to the second calculation device when the second calculation device is confirmed to be capable of executing the one calculation and not to perform another calculation within a first prescribed time slot among the plurality of time slots in which the one calculation is performed.

In one embodiment of the invention, the circuit synthesis method further includes the step of, when the feedback loop is not deleted by assigning the one calculation to the second calculation device, allocating a third calculation device and assigning the one calculation to the third calculation device so as to delete the feedback loop.

In one embodiment of the invention, the step of allocating the third calculation device includes the step of allocating the third calculation device by forming a replication of the first calculation device.

In one embodiment of the invention, the step of allocating the third calculation device by forming a replication of the first calculation device includes the step of forming a replication of the first calculation device as a calculation device having a minimum area among the at least two calculation devices included in the feedback loop.

According to another aspect of the invention, a recording medium having a program written thereon for causing a computer to execute circuit synthesis is provided. The synthesis is performed by a method including the steps of converting a behavioral description describing a behavior of calculation processing into a control data flowgraph; assigning a plurality of calculations, at least one input and at least one output in the control data flowgraph into a plurality of prescribed time slots; assigning the plurality of calculations, a plurality of data dependency edges, the at least one input and the at least one output respectively to a plurality of calculation devices, at least one register, at least one input pin and at least one output pin; generating a plurality of paths corresponding to the plurality of data dependency edges; detecting a feedback loop formed of at least two of the plurality of paths and at least one of the plurality of calculation devices; and re-assigning one calculation, which has been assigned to a first calculation device included in the feedback loop, to a second calculation device among the plurality of calculation devices, so as to delete the feedback loop.

Thus, the invention described herein makes possible the advantages of providing a circuit synthesis method for preventing an RTL logic circuit generated from a behavioral description from being destabilizing due to oscillation or the like and for allowing automatic design of an RTL logic circuit for which static timing analysis is relatively easy.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 9:
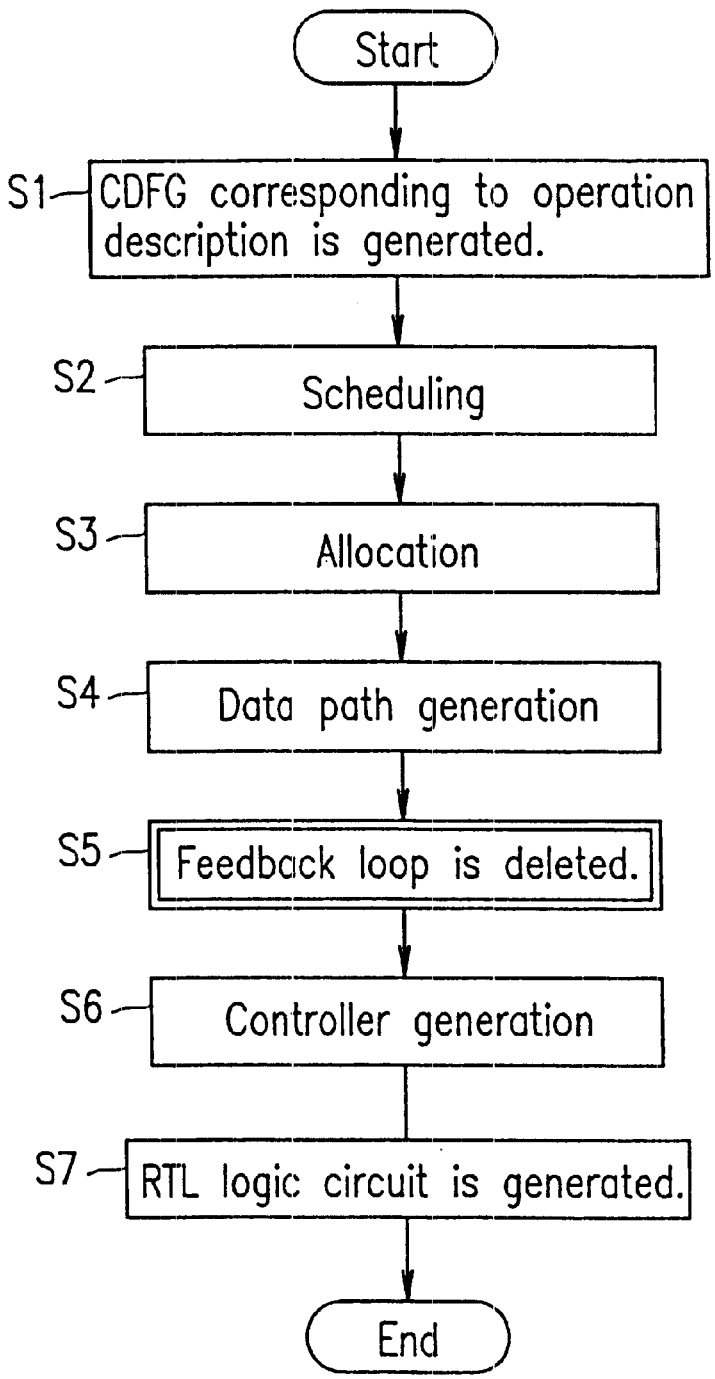
FIG. 9 is a flowchart illustrating an exemplary high level synthesis method according to the present invention.

FIG. 9 is a flowchart illustrating an exemplary high level synthesis method in an example according to the present invention. The high level synthesis method will be described with reference to FIG. 9.

Figure 1:
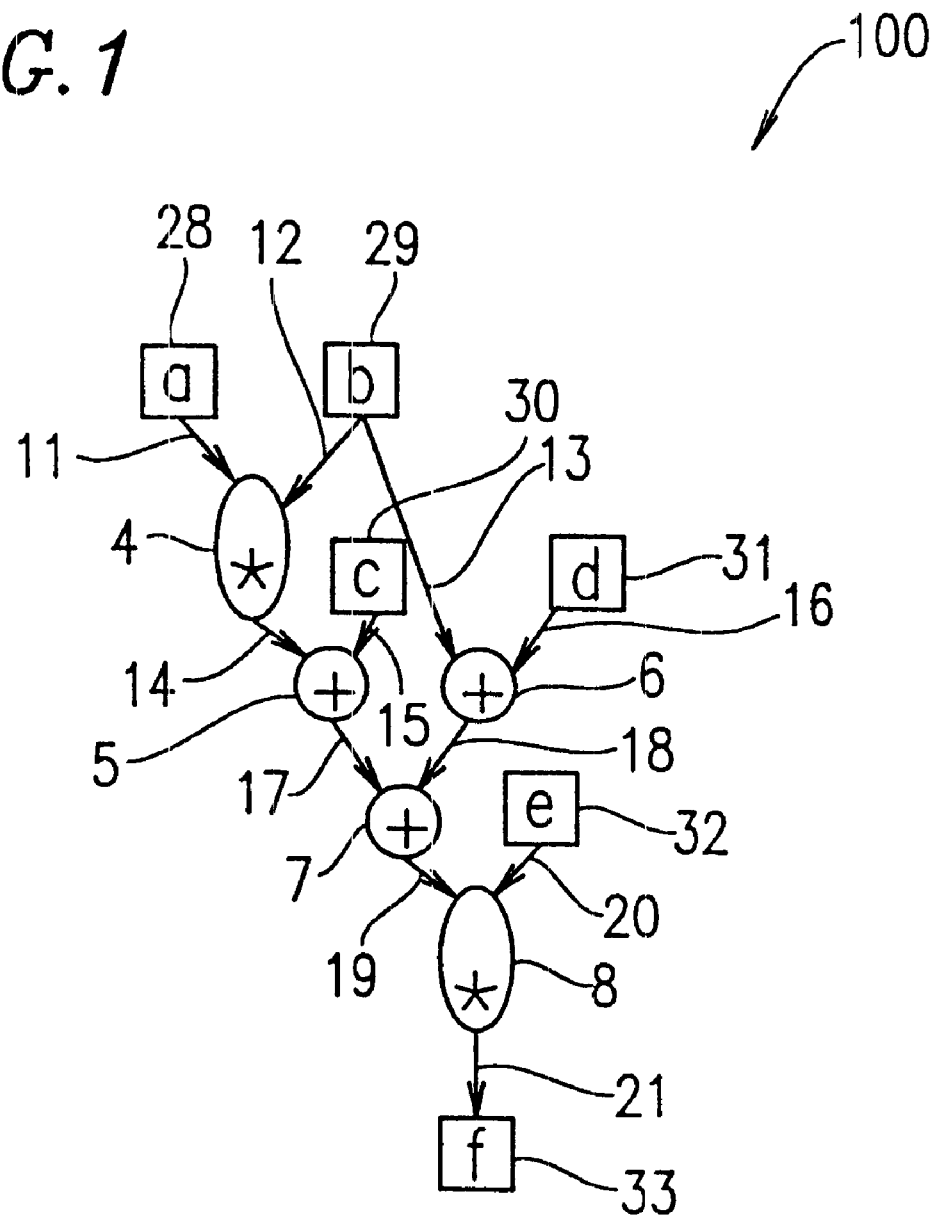
FIG. 1 shows an exemplary CDFG in a high level synthesis method.
Figure 2:
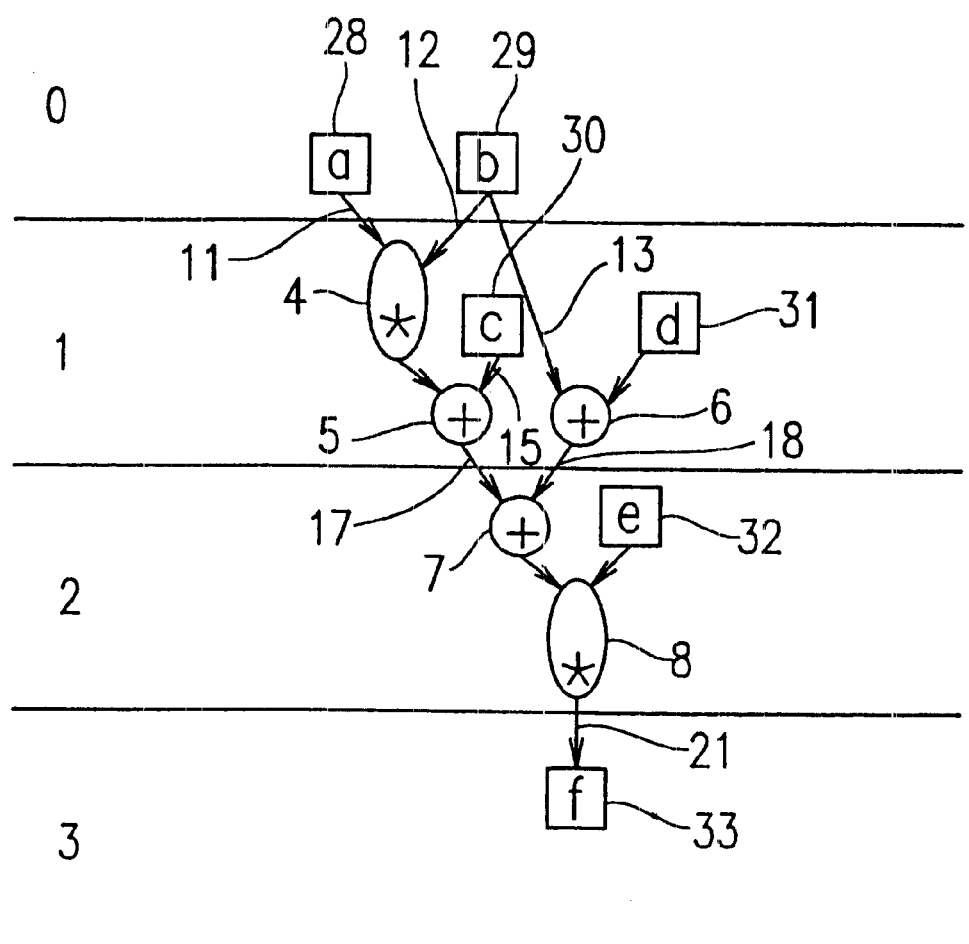
FIG. 2 shows an exemplary scheduling result obtained as a result of scheduling the CDFG shown in FIG. 1.
Figure 4:
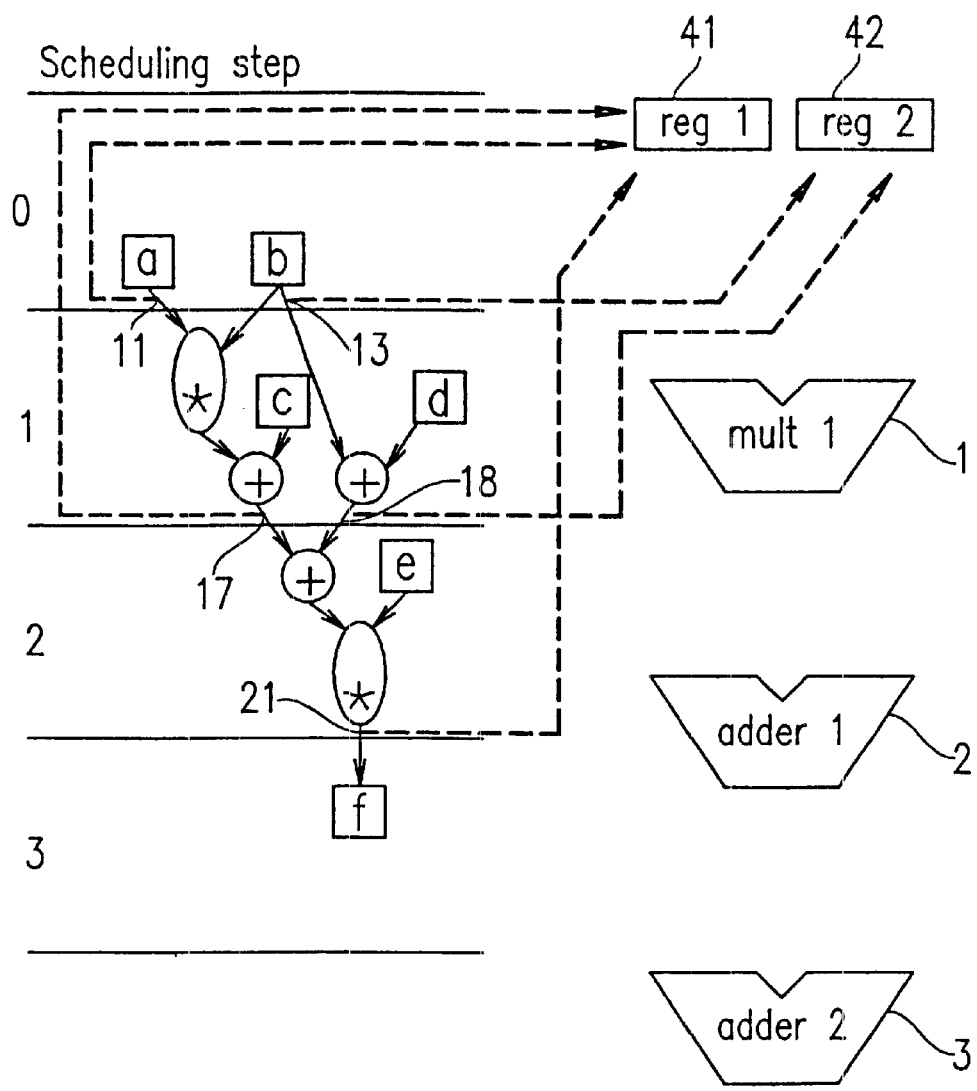
Figure 5:
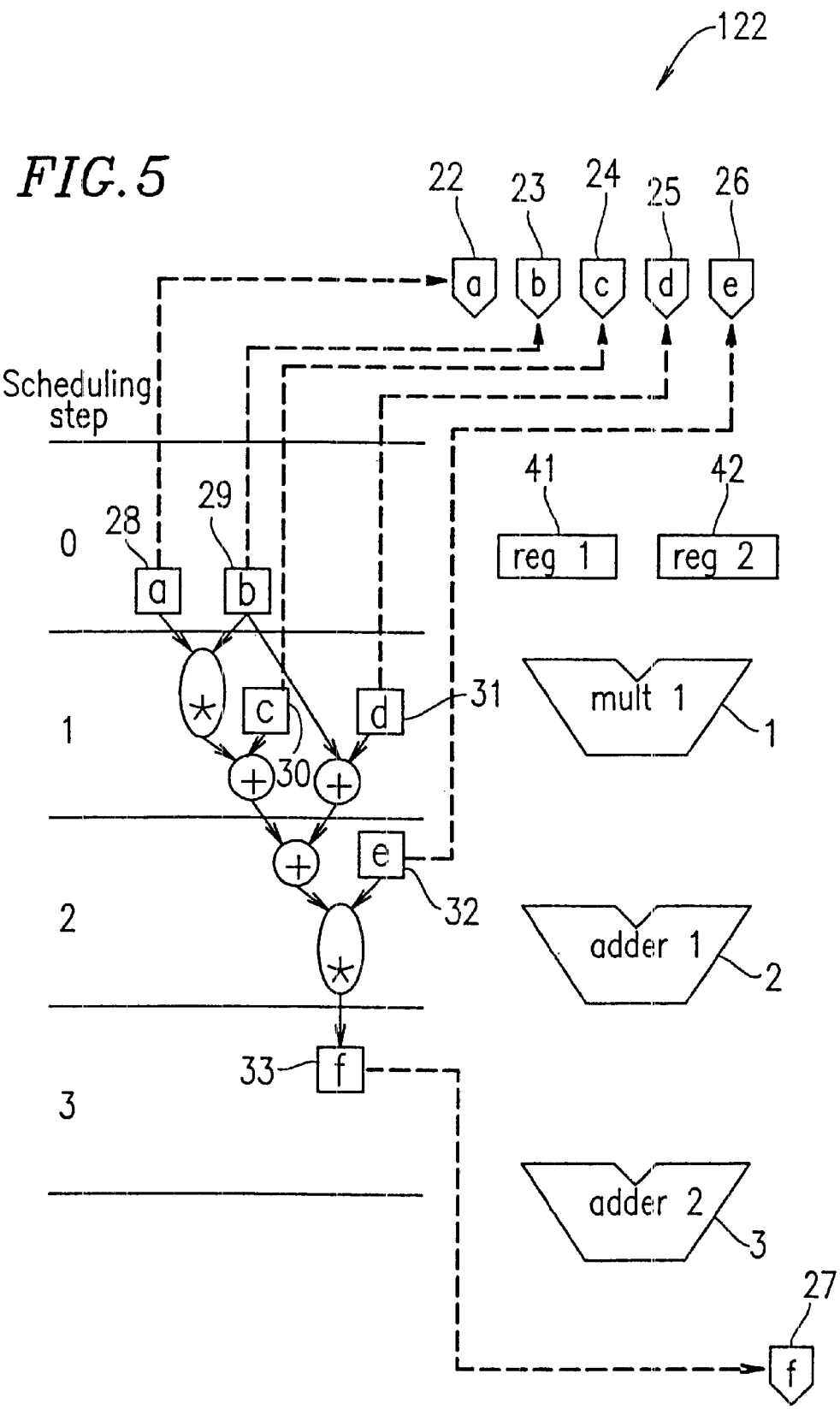
Figure 6:
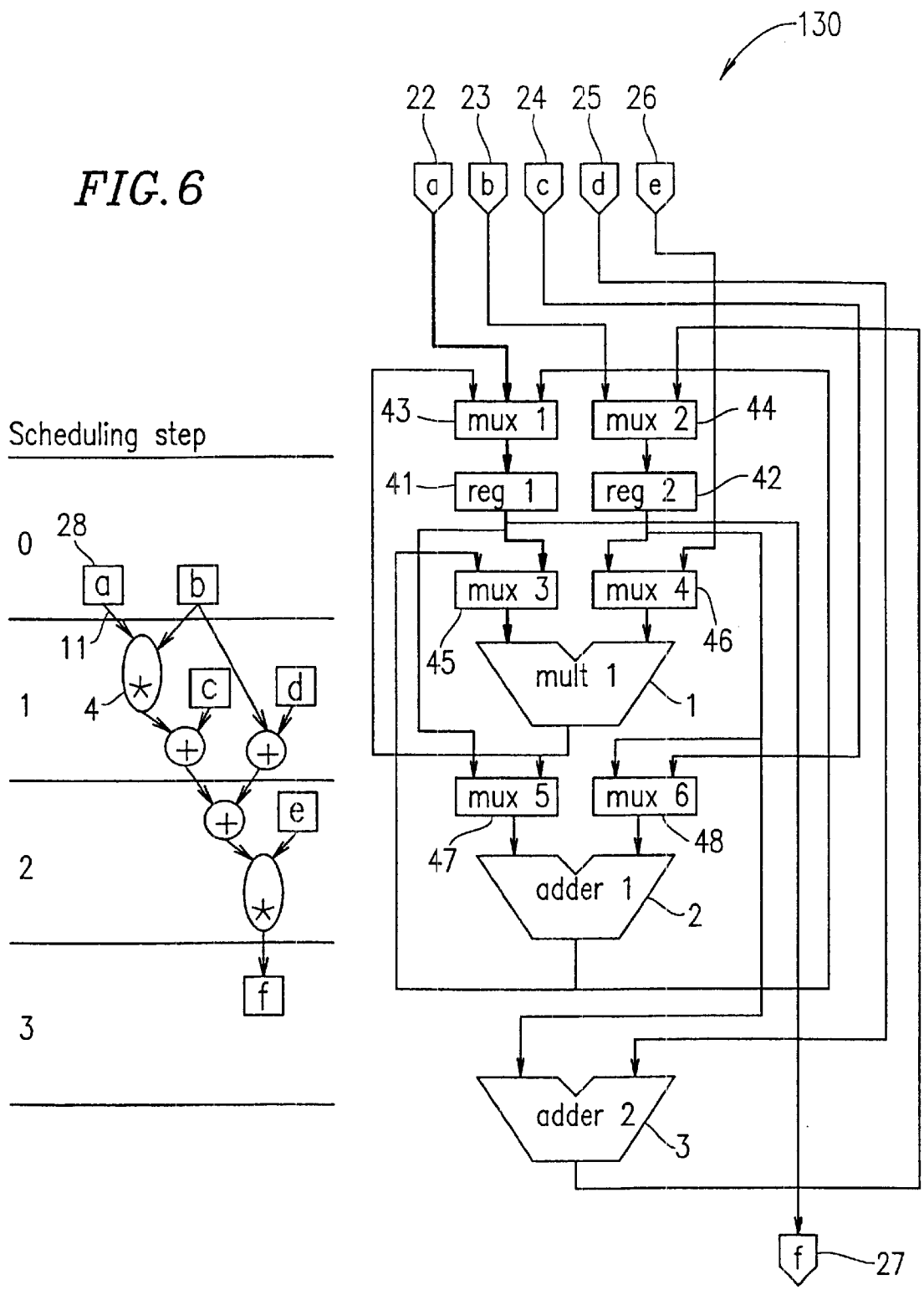
FIG. 6 shows an exemplary data path generation result obtained as result of data path generation performed on the CDFG shown in FIG. 1.
Figure 7:
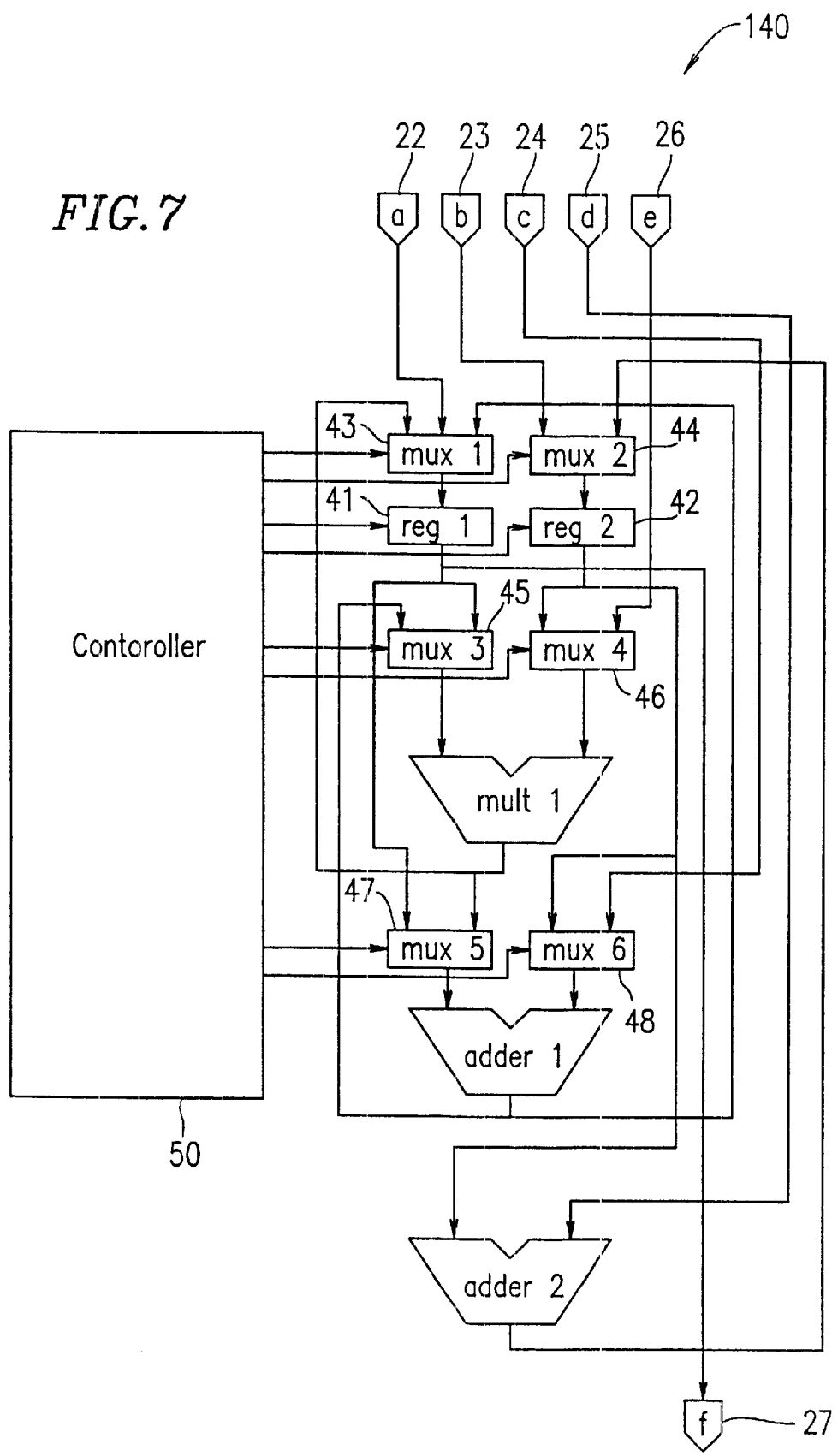
FIG. 7 shows an exemplary controller generation result obtained as a result of generating a controller for the CDFG shown in FIG. 1.
Figure 8:
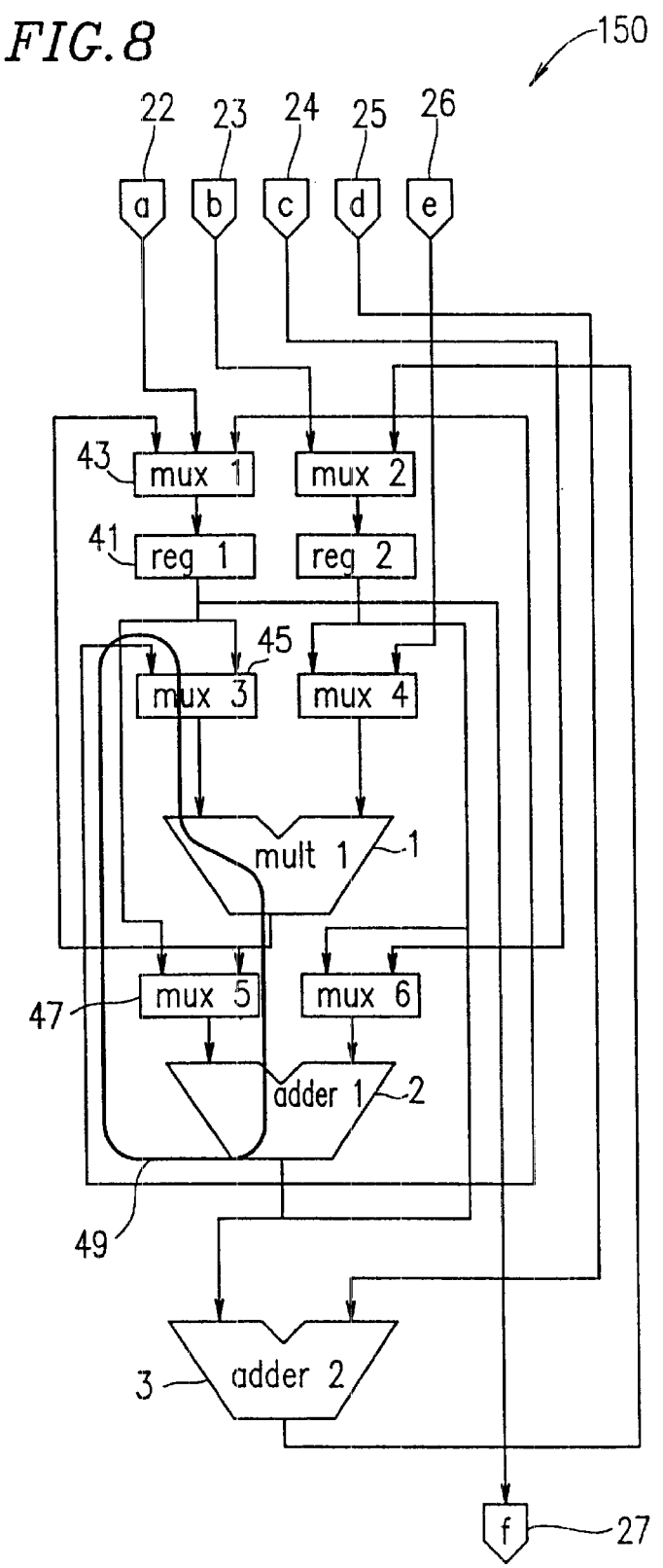
FIG. 8 shows an exemplary feedback loop formed as result of data path generation performed on the CDFG shown in FIG. 1.

First, in step S1, a behavioral description of expression (1) set forth above is input to a high level synthesis tool, thereby generating a CDFG corresponding to the behavioral description. Then, in step S2, the CDFG is scheduled as described above with reference to FIG. 2. In step S3, allocation is performed for the scheduled CDFG as described above with reference to FIGS. 3, 4 and 5. Then, in step S4, data path generation is performed as described above with reference to FIG. 6. In step S5, a feedback loop is deleted. In step S6, controller generation is performed. Then, in step S7, the RTL logic circuit is formed. The feedback loops can be deleted before the data path generation according to the present invention.

Figure 10:
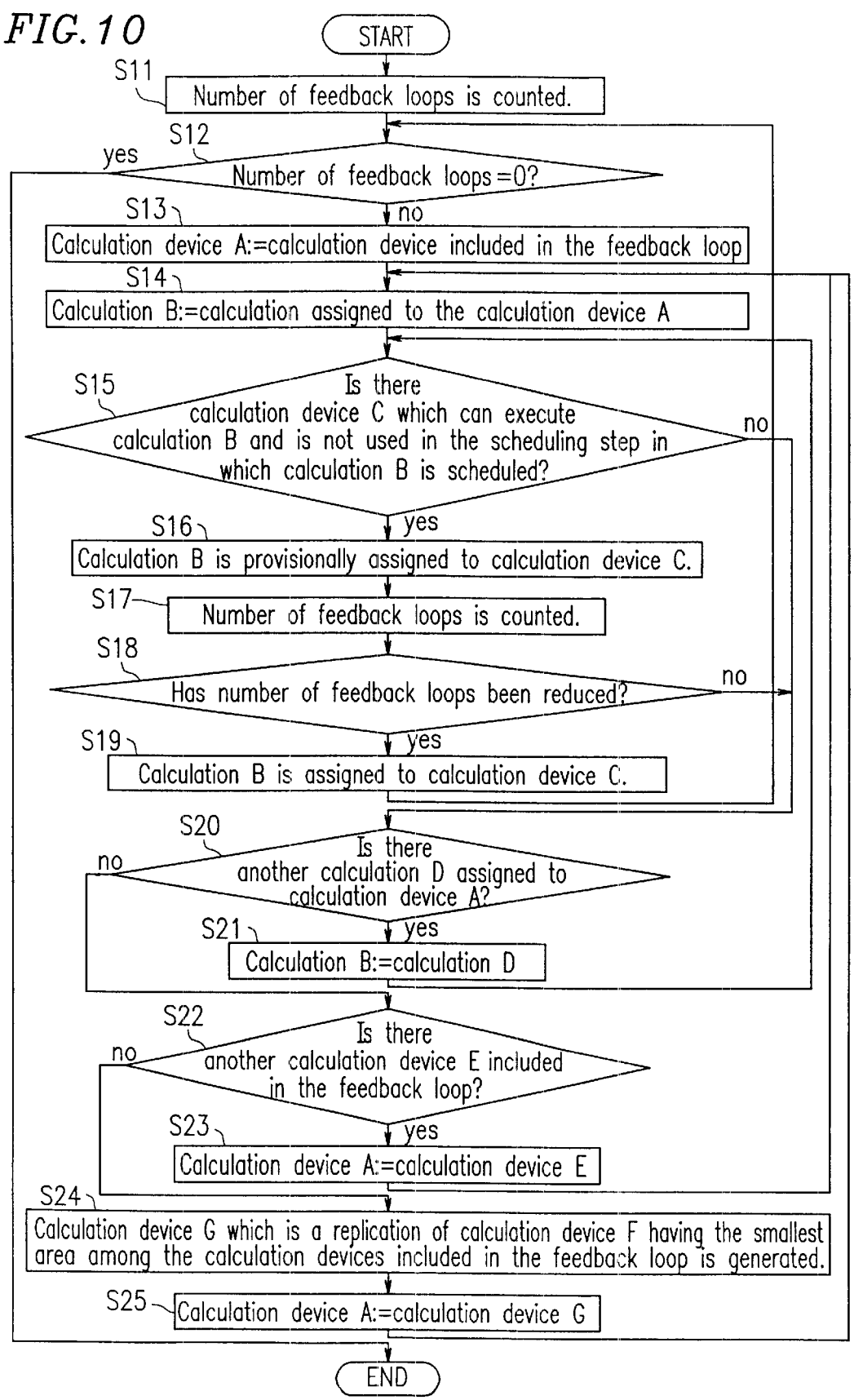
FIG. 10 is a flowchart illustrating the processing of step S4 in FIG. 9.

FIG. 10 is a flowchart illustrating the processing of deleting the feedback loop in step S5 in FIG. 9.

In step S11, the number of the feedback loops is counted. The number of the feedback loops can be counted even before the data path generation, based on the CDFG and the allocation result for calculation devices.

In step S12, it is determined whether or not there is at least one feedback loop based on the result of counting. When it is determined that there is at least one feedback loop in step S12, the processing advances to step S13. In step S13, a calculation device A which is included in the feedback loop is detected. In step S14, a calculation B which is assigned to the calculation device A is found. The calculation B is assigned to a different calculation device as follows.

In step S15, it is determined whether or not there is a calculation device C which can execute the calculation B and which is not used in the scheduling step in which the calculation B is scheduled. When it is determined that there is such a calculation device C in step S15, the processing advances to step S16. In step S16, the calculation B is provisionally assigned to the calculation device C. In step S17, the number of the feedback loops is counted. In step S18, it is determined whether or not the number of the feedback loops has been reduced. When it is determined that the number of the feedback loops has been reduced in step S18, the processing advances to step S19. In step S19, the provisional assignment is adopted, namely, the calculation B is fixed to be assigned to the calculation device C.

When it is determined that there is no calculation device C which can execute the calculation B and which is not used in scheduling step in which the calculation B is scheduled in step S15, or when it is determined that the number of the feedback loops has not been reduced by the assignment of the calculation B to the calculation device C in step S18, the processing advances to step S20. In step S20, it is determined whether or not there is a different calculation D which is assigned to the calculation device A. When it is determined that there is such a calculation D in step S20, the processing advances to step S21. In step S21, the target of assignment is changed from the calculation B to the calculation D, and the processing in steps S15 through S19 is repeated for the calculation D.

When the number of the feedback loops is not reduced by such processing, it is determined whether or not there is another calculation device E included in the feedback loop in step S22. When it is determined that there is such a calculation device E in step S22, the processing goes to step S23. In step S23, the target of assignment is changed from the calculation device A to the calculation device E, and the processing in steps S14 through S19 is repeated for the calculation device E.

When the number of the feedback loops is not reduced as a result of changing the assignment of the calculations to all the calculation devices included in the feedback loop, a calculation device G is newly allocated in step S24. In order to minimize the increase in the area of the RTL logic circuit, it is preferable to form a replication of a calculation device F which has the smallest size among all the calculation devices included in the feedback loop. When the calculation devices A and F can execute the same type of calculation, in step S25, the target of assignment is changed from the calculation device A to the calculation device G. The processing in steps S14 through S19 is repeated for the calculation device G.

Such processing is performed for each feedback loop detected. Thus, the all the feedback loops can be deleted.

A practical exemplary procedure for deleting a feedback loop will be described below.

Figure 3:
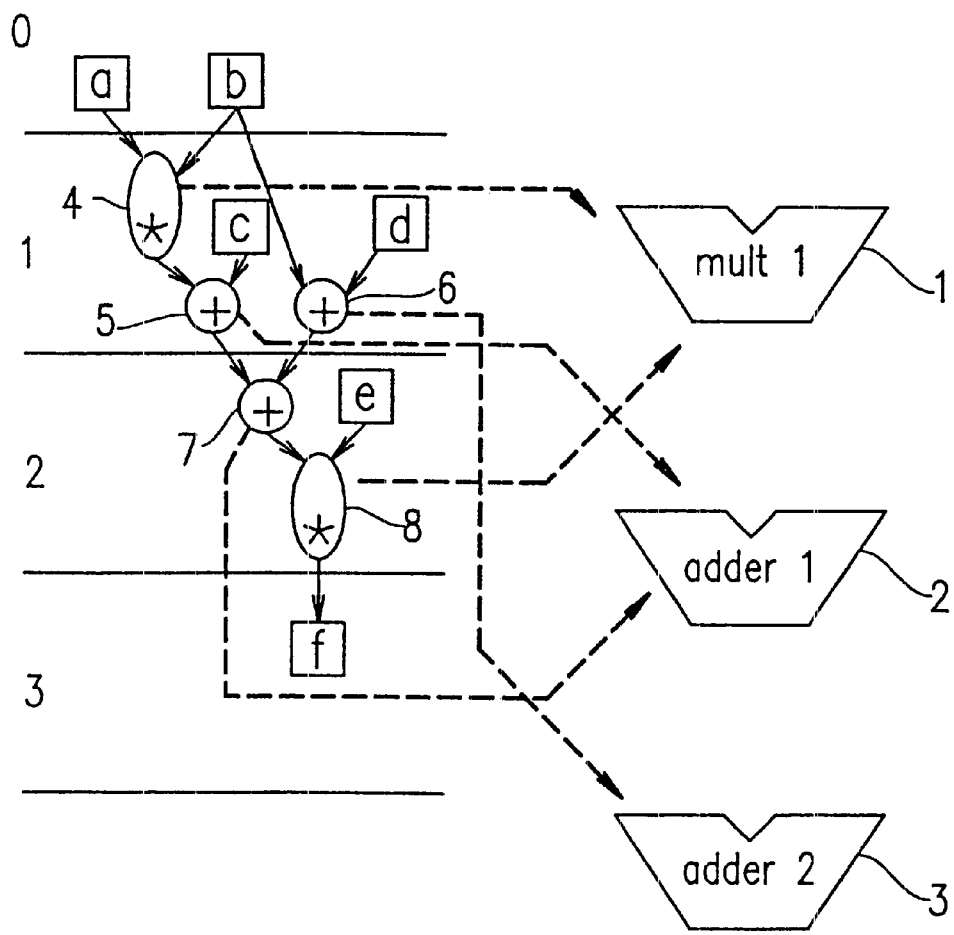
FIGS. 3 through 5 show exemplary allocation results obtained as a result of performing allocation on the CDFG shown in FIG. 1.
Figure 11:
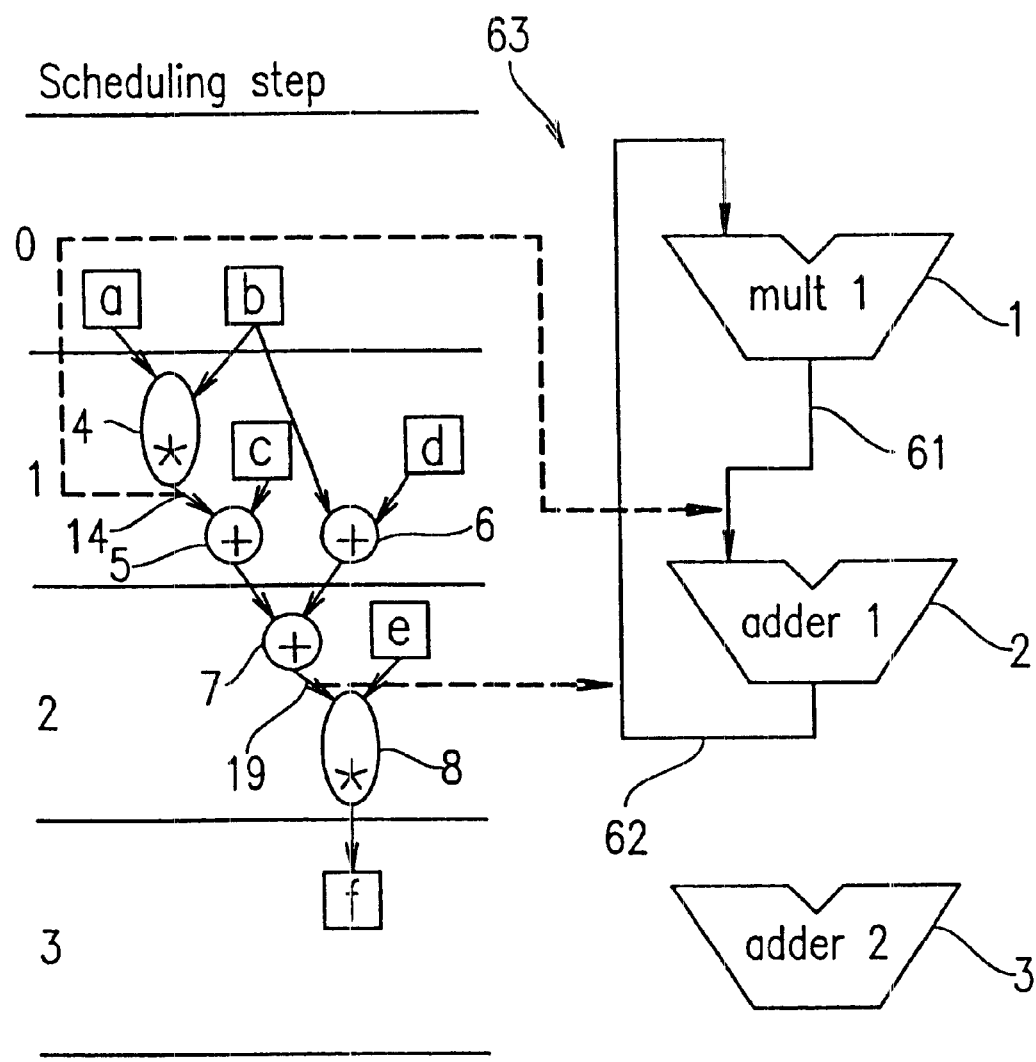
FIGS. 11 through 13 show a procedure of deleting a feedback loop by changing the assignment of calculations to calculation devices included in the feedback loop according to the present invention.
Figure 12:
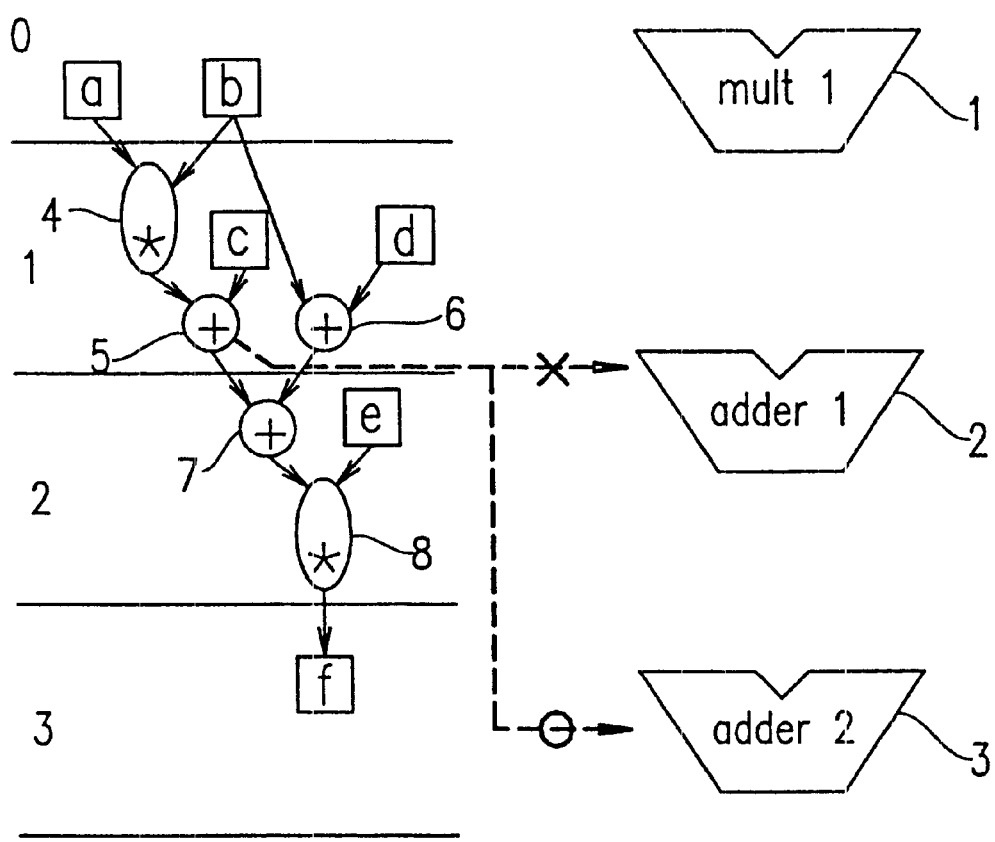
Figure 13:
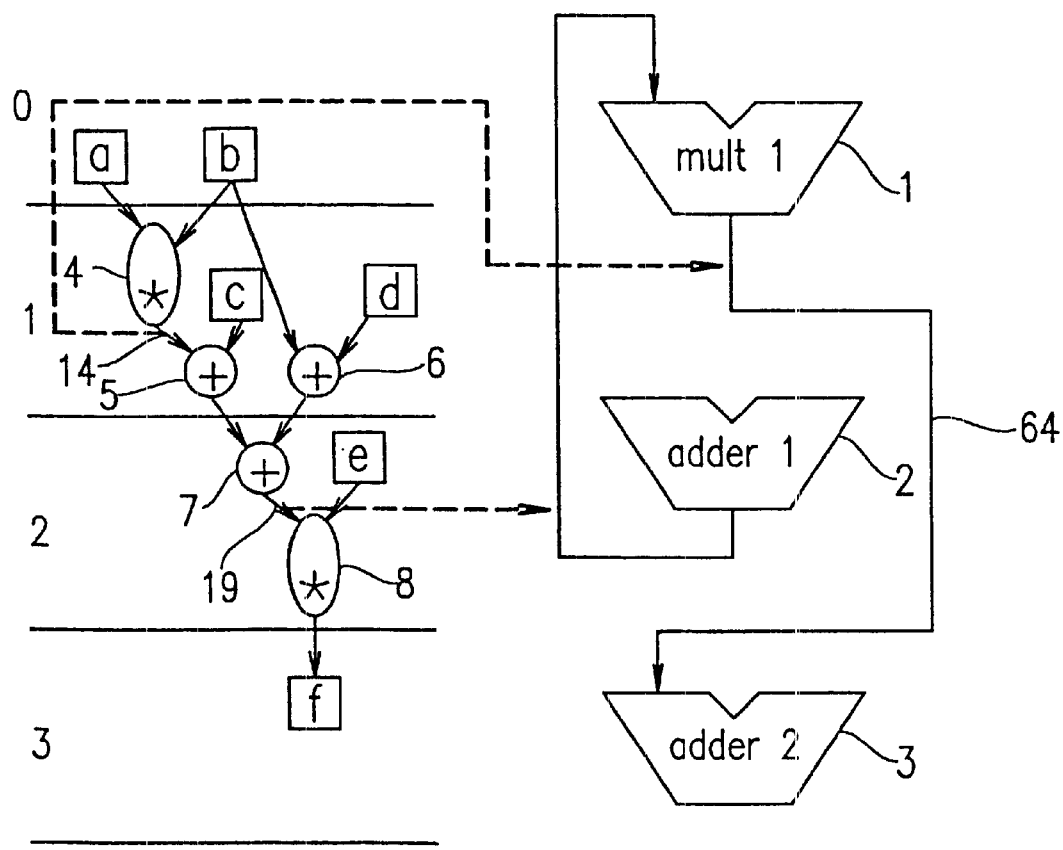

FIGS. 11 through 13 show how the feedback loop formed based on the allocation shown in FIG. 3 is deleted. When the allocation result for the calculation devices shown in FIG. 3 is obtained, the feedback loop is detected based on information on data dependency edges which do not cross any clock boundary between two adjacent scheduling steps.

In more detail, as shown in FIG. 11, a path 61 from the multiplier 1 to the first adder 2 is detected based on the data dependency edge 14 from the first multiplication 4 to the first addition 5. A path 62 from the first adder 2 to the multiplier 1 is detected based on the data dependency edge 19 from the third addition 7 to the second multiplication 8. As a result, a feedback loop 63 from the multiplier 1 through the first adder 2 to the multiplier 1 is detected. The number of feedback loops, 1, is set (step S11 in FIG. 10).

When the feedback loop 63 is detected, the process moves to the multiplier 1 included in the feedback loop 63 and the first multiplication 4 assigned to the multiplier 1. It is determined whether or not there is a multiplier which can execute the multiplication and which is not used in scheduling step 1 in which the first multiplication 4 is scheduled (step S15). Since there is no such multiplier, it is determined whether or not there is another calculation assigned to the multiplier 1. The second multiplication 8 is also assigned to the multiplier 1 (step S20).

It is determined whether or not there is a multiplier which can execute the multiplication and which is not used in scheduling step 2 in which the second multiplication 8 is scheduled. Since there is no such multiplier, the process moves to the first adder 2 included in the feedback loop 63 and the first addition 5 assigned to the first adder 2 (step S22). It is determined whether or not there is an adder which can execute the addition and which is not used in scheduling step 1 in which the first addition 5 is scheduled (step S15). The second adder 3 can execute the addition and which is not used (i.e., usable) in scheduling step 1. Accordingly, as shown in FIG. 12, the first addition 5 is provisionally assigned to the second adder 3 (step S16).

As a result, as shown in FIG. 13, the data dependency edge 14 from the first multiplication 4 to the first addition 5 now corresponds to a path 64 from the first multiplier 1 to the second adder 3 which is newly formed. The feedback loop 63 is deleted and the number of the feedback loops is reduced by 1. When it is confirmed that the number of the feedback loops is reduced, the first addition 1 is fixed to be assigned to the second adder 3 (step S19). The number of the feedback loops detected is reduced from 1 to 0. Thus, the algorithm for deleting the feedback loop is completed.

There are cases in which all the feedback loops cannot be deleted by changing the assignment of the calculations to the calculation devices allocated by the allocation procedure 120 (FIG. 3). In those cases, a replication of a calculation device included in the feedback loop which cannot be deleted is formed, and a calculation or calculations included in the feedback loop is assigned to the replication of the calculation device. Thus, all the feedback loops can be deleted. It is preferable to form a replication of a calculation device having a minimum possible area in order to minimize the increase in the area of the resultant RTL logic circuit.

Such processing will be described with reference to FIGS. 14 through 17. In the following example, an RTL is formed based on a behavioral description of expression (2).

$$f=\{(a*b)+c+d)\}*e \qquad (2)$$

Figure 14:
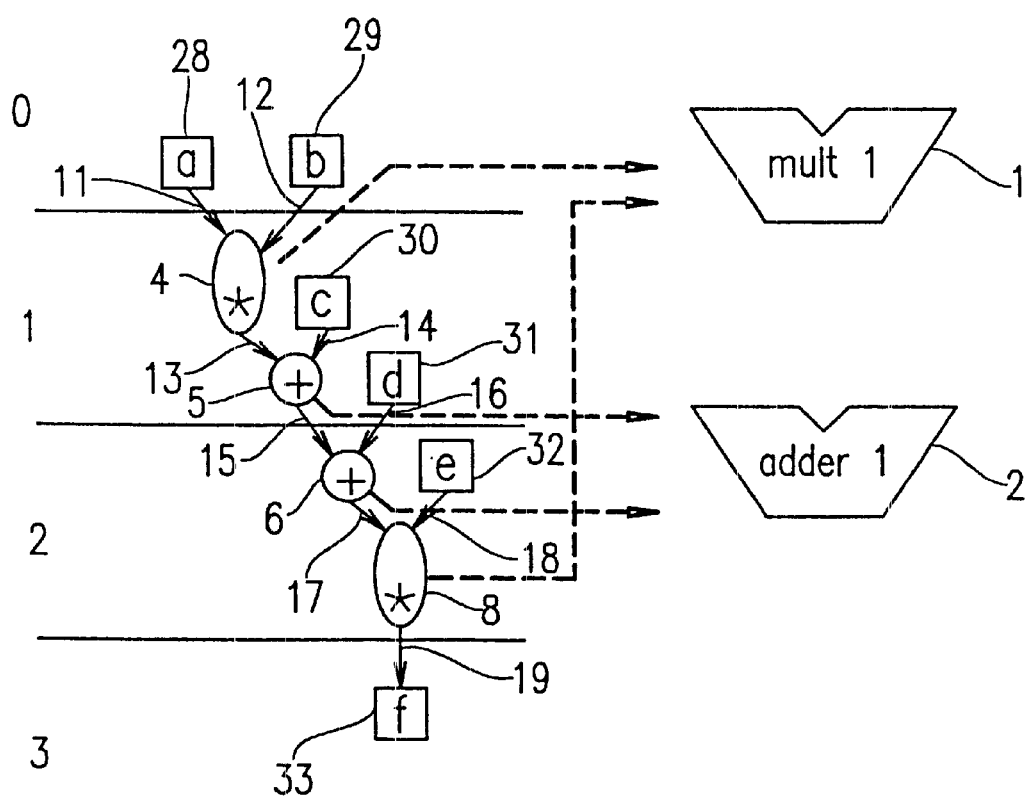
FIGS. 14 through 17 show a procedure of deleting a how a feedback loop by allocating a new calculation device according to the present invention.

First, the behavioral description of expression (2) is converted into a CDFG. The CDFG is processed with scheduling and allocation as described above, and as a result, the allocation result shown in FIG. 14 is obtained. As shown in FIG. 14, an input "a" 28 and an input "b" 29 are scheduled in scheduling step 0. A first multiplication 4, an input "c" 30 and a first addition 5 are scheduled in scheduling step 1. A second addition 6, an input "e" 32 and a second multiplication 8 are scheduled in scheduling step 2. Only an output "f" 33 is scheduled in scheduling step 3.

A data dependency edge 11 from the input "a" 28 to the first multiplication 4 and a data dependency edge 12 from the input "b" 29 to the first multiplication 4 cross a clock boundary between scheduling steps 0 and 1. A data dependency edge 15 from the first addition 5 to the second addition 6 and a data dependency edge 16 from the input "d" 31 to the second addition 6 cross the clock boundary between scheduling steps 1 and 2. A data dependency edge 19 from the second multiplication 8 to the output "f" 33 crosses the clock boundary between scheduling steps 2 and 3.

The first multiplication 4 and the second multiplication 8 are scheduled in different scheduling steps (1 and 2). Therefore, one multiplier 1 is allocated, to which the first multiplication 4 and the second multiplication 8 are assigned. The first addition 5 and the second addition 6 are scheduled in different scheduling steps (1 and 2). Therefore, one adder 1 is allocated, to which the first addition 5 and the second addition 6 are assigned.

When such an allocation result is obtained, a feedback loop is detected based on information on a data dependency edge which does not cross any clock boundary between two adjacent scheduling steps.

Figure 15:
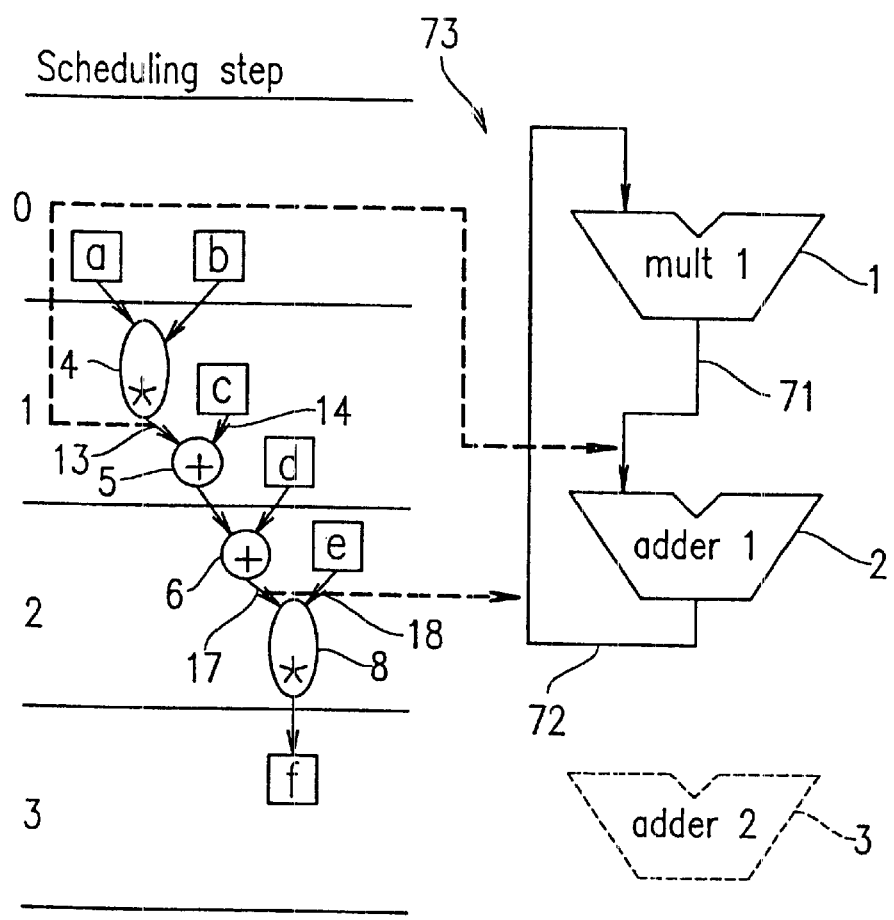

As shown in FIG. 15, a path 71 from the multiplier 1 to the adder 2 is detected from the data dependency edge 13 from the first multiplication 4 to the first addition 5. A path 72 from the adder 2 to the multiplier 1 is detected from the data dependency edge 17 from the second addition 6 to the second multiplication 8. Thus, a feedback loop 73 formed of the paths 71 and 72 is detected (step S11 in FIG. 10).

When the feedback loop 73 is detected, the process moves to the multiplier 1 included in the feedback loop 73 and the first multiplication 4 assigned to the multiplier 1. It is determined whether or not there is a multiplier which can execute the multiplication and which is not used in scheduling step 1 in which the first multiplication 4 is scheduled. Since there is no such multiplier, it is determined whether or not there is another calculation assigned to the multiplier 1 (step S20). The second multiplication 8 is also assigned to the multiplier 1.

Figure 16:
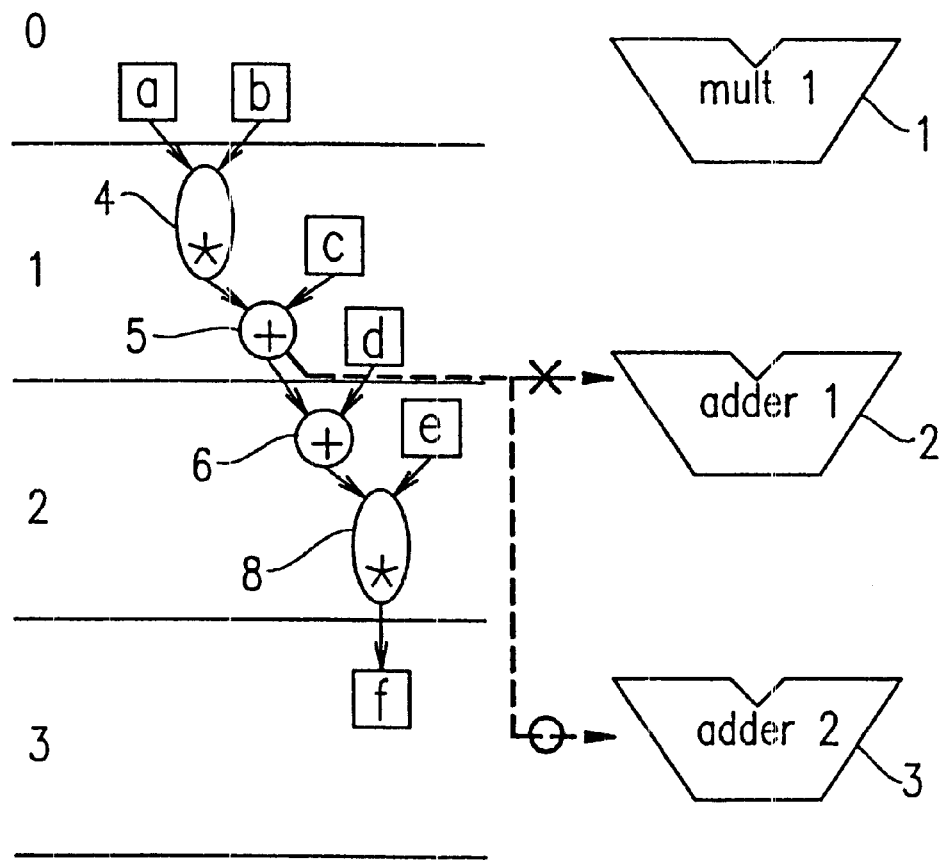

It is determined whether or not there is a multiplier, other than the multiplier 1, which can execute the multiplication and which is not used in scheduling step 2 in which the second multiplication 8 is scheduled. Since there is no such multiplier, the process moves to the adder 2 included in the feedback loop 73 and the first addition 5 assigned to the adder 2 (step S23). It is determined whether or not there is an adder, other than the adder 2, which can execute the addition and which is not used in scheduling step 1 in which the first addition 5 is scheduled. Since there is no such adder, it is determined whether or not there is another calculation assigned to the adder 2 (step S20). The second addition 6 is assigned to the adder 2. However, there is no other adder than the adder 2 in scheduling step 2 in which the second addition 6 is scheduled, and in addition, there is no other calculation device than the multiplier 1 and the adder 2 included in the feedback loop 73 (step S22). Accordingly, as shown in FIGS. 15 and 16, a second adder 3 is formed as a replication of the adder 2 (step S24). The reason why the replication of the adder 2 is formed is that the adder 2 is the smaller of the two calculation devices included in the feedback loop 73. Thus, the first addition 5 is provisionally assigned to the second adder 3 (step S25).

Figure 17:
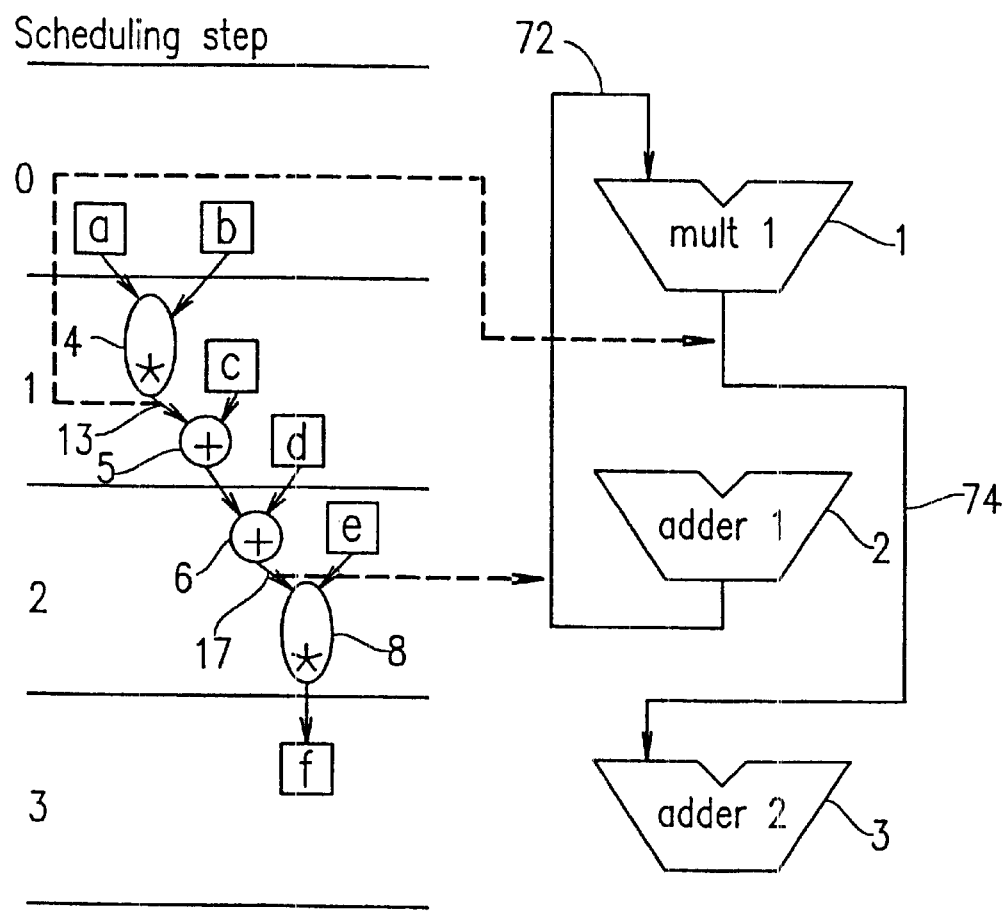

As a result, as shown in FIG. 17, the data dependency edge 13 from the first multiplication 4 to the first addition 5 corresponds to a path 74 from the multiplier 1 to the second adder 3 which is newly formed. It is confirmed that the feedback loop 73 is deleted. Then, the first addition 5 is fixed to be assigned to the second adder 3. The number of the feedback loops detected is reduced from 1 to 0. Thus, the algorithm for deleting the feedback loop is completed.

A program for executing the above-described circuit synthesis method according to the present invention is recordable on arbitrary recording mediums such as, for example, magnetic disks and optical disks.

The circuit synthesis method according to the present invention is applicable to any behavioral description instead of the behavioral descriptions mentioned in the above-described example.

According to the present invention, a feedback loop formed of a combination of portions of true paths is automatically detected and deleted. This facilitates the designing of an RTL logic circuit with a reduced number of feedback loops. The resultant RTL circuit is prevented from being destabilized due to oscillation or the like, and facilitates static timing analysis.

Since calculations allocated by the allocation of the calculation devices are utilized to delete the feedback loops, the area of the RTL logic circuit is prevented from increasing.

The feedback loops which cannot be deleted utilizing the calculation devices allocated by the allocation can be deleted by generating a replication of one of the calculation devices. In this case, the replication of the calculation device having the smallest area among the available calculation devices is generated. Thus, an increase in the area of the RTL circuit can be minimized.

The recording medium having a program executing the above-described circuit synthesis method according to the present invention allows a system including such the recording medium to execute the circuit synthesis method.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit synthesis method, comprising the steps of:
   converting a behavioral description describing a behavior of calculation processing into a control data flowgraph;
   assigning a plurality of calculations, at least one input and at least one output in the control data flowgraph into a plurality of prescribed time slots;
   assigning the plurality of calculations, a plurality of data dependency edges, the at least one input and the at least one output respectively to a plurality of calculation devices, at least one register, at least one input pin and at least one output pin;
   generating a plurality of paths corresponding to the plurality of data dependency edges:
   detecting a feedback loop formed of at least two of the plurality of paths and at least one of the plurality of calculation devices; and
   re-assigning one calculation, which has been assigned to a first calculation device included in the feedback loop, to a second calculation device among the plurality of calculation devices, so as to delete the feedback loop.

2. A circuit synthesis method according to claim 1, wherein the step of re-assigning includes the step of assigning the one calculation to the second calculation device when the second calculation device can execute the one calculation and cannot perform another calculation within a first prescribed time slot among the plurality of prescribed time slots in which the one calculation is performed.

3. A circuit synthesis method according to claim 1, further comprising the step of, when the feedback loop is not deleted by assigning the one calculation to the second calculation device, allocating a third calculation device and assigning the one calculation to the third calculation device so as to delete the feedback loop.

4. A circuit synthesis method according to claim 3, wherein the step of allocating the third calculation device includes the step of allocating the third calculation device by forming a replication of the first calculation device.

5. A circuit synthesis method according to claim 4, wherein the step of allocating the third calculation device by forming a replication of the first calculation device includes the step of forming a replication of the first calculation device as a calculation device having a minimum area among the at least two calculation devices included in the feedback loop.

6. A recording medium having a program written thereon for causing a computer to execute circuit synthesis, the circuit synthesis being performed by a method comprising the steps of:
   converting a behavioral description describing a behavior of calculation processing into a control data flowgraph;
   assigning a plurality of calculations, at least one input and at least one output in the control data flowgraph into a plurality of prescribed time slots;
   assigning the plurality of calculations, a plurality of data dependency edges, the at least one input and the at least one output respectively to a plurality of calculation devices, at least one register, at least one input pin and at least one output pin;
   generating a plurality of paths corresponding to the plurality of data dependency edges; and
   detecting a feedback loop formed of at least two of the plurality of paths and at least one of the plurality of calculation devices; and
   re-assigning one calculation, which has been assigned to a first calculation device included in the feedback loop, to a second calculation device among the plurality of calculation devices, so as to delete the feedback loop.

* * * * *